United States Patent [19]

Bright et al.

[11] Patent Number: 4,502,747
[45] Date of Patent: Mar. 5, 1985

[54] PAD ARRAY SOCKET

[75] Inventors: Edward J. Bright, Elizabethtown; Steven J. Kandybowski, Tower City; Wilmer L. Sheesley, Dauphin; David B. Sinisi, Middletown, all of Pa.

[73] Assignee: AMP Incorporated, Harrisburg, Pa.

[21] Appl. No.: 601,732

[22] Filed: Apr. 18, 1984

Related U.S. Application Data

[63] Continuation of Ser. No. 391,621, Jun. 24, 1982, abandoned.

[51] Int. Cl.³ .................. H01R 9/09; H01R 23/72
[52] U.S. Cl. .................. 339/75 M; 220/259; 339/17 CF
[58] Field of Search .............. 339/17 CF, 174, 75 M, 339/75 MP; 220/324, 259

[56] References Cited

U.S. PATENT DOCUMENTS

| | | | |
|---|---|---|---|
| 1,050,265 | 1/1913 | Crone | 220/259 |
| 2,016,606 | 10/1935 | Krueger | 220/259 |
| 3,568,129 | 3/1971 | Gold et al. | 339/17 CF |
| 3,737,067 | 6/1973 | Palson | 220/324 |
| 3,846,737 | 11/1974 | Spaulding | 339/17 CF |
| 4,278,311 | 7/1981 | Scheingold et al. | 339/17 CF |
| 4,376,560 | 3/1983 | Olsson | 339/17 CF |

FOREIGN PATENT DOCUMENTS 188643  4/1937  Switzerland ............ 220/259

OTHER PUBLICATIONS

IBM Bulletin, Bruder, vol. 13, No. 5, p. 1265, 10-1970.

Primary Examiner—Neil Abrams
Attorney, Agent, or Firm—Allan B. Osborne

[57] ABSTRACT

The present invention relates to a chip carrier socket having two opposing hinged frames, one to clamp and positively latch the other against the carrier. More particularly the socket contains a plurality of contact elements with generally horizontally extending contact surfaces to engage the carrier pads. The hinged frames include one having a double spring construction for bearing against the carrier and another having extended arms overlying the first frame and clamping it against the carrier.

3 Claims, 6 Drawing Figures

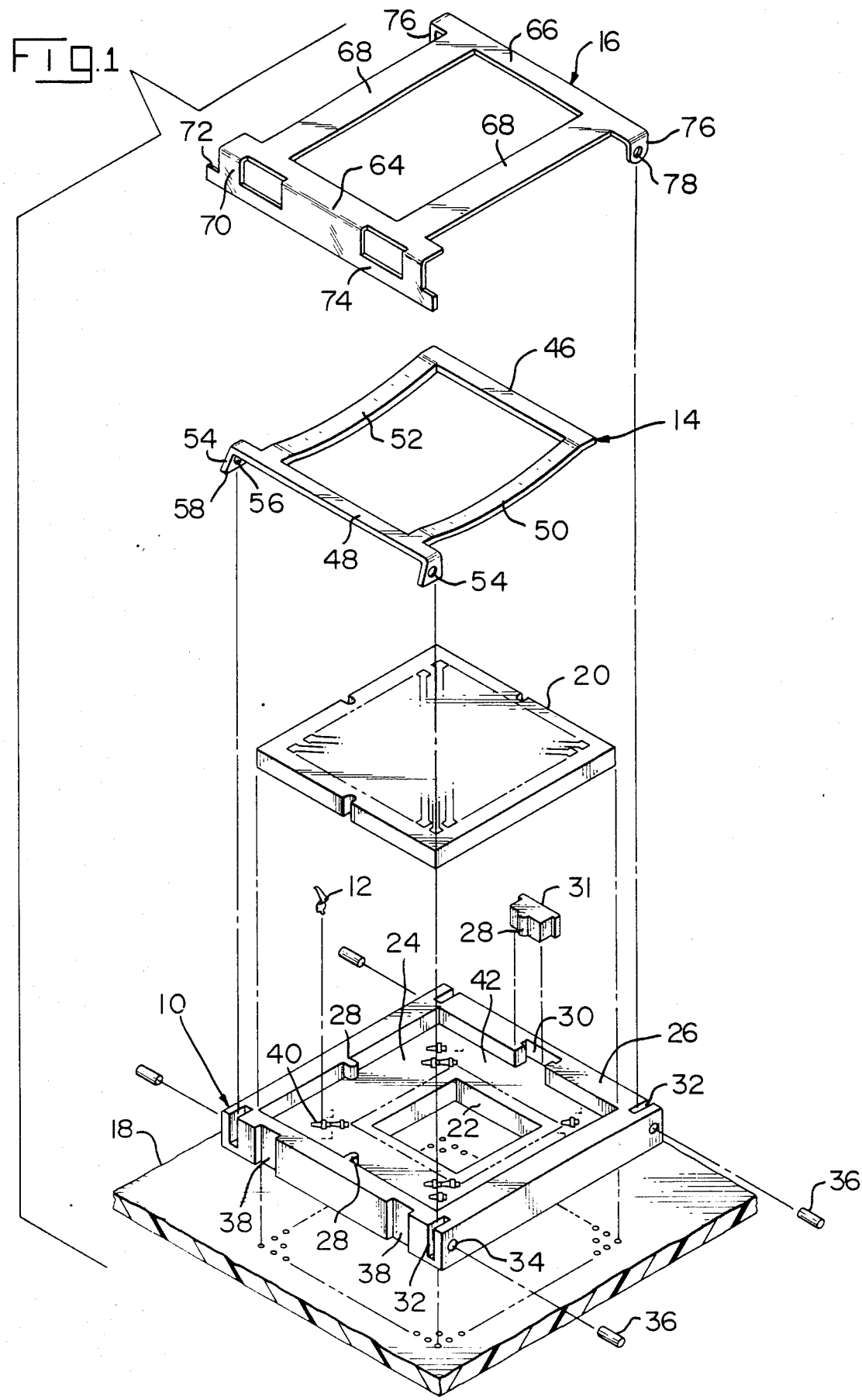

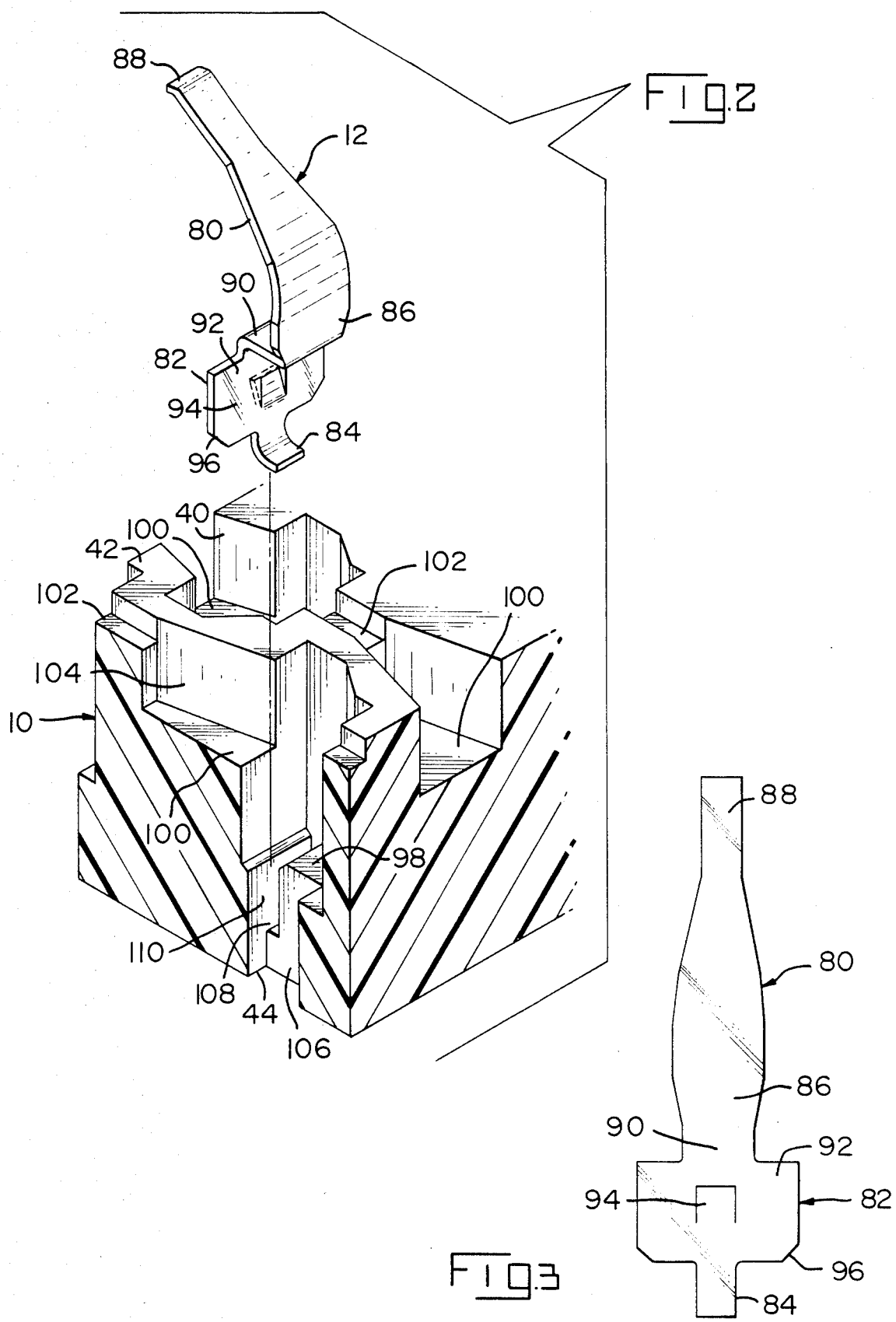

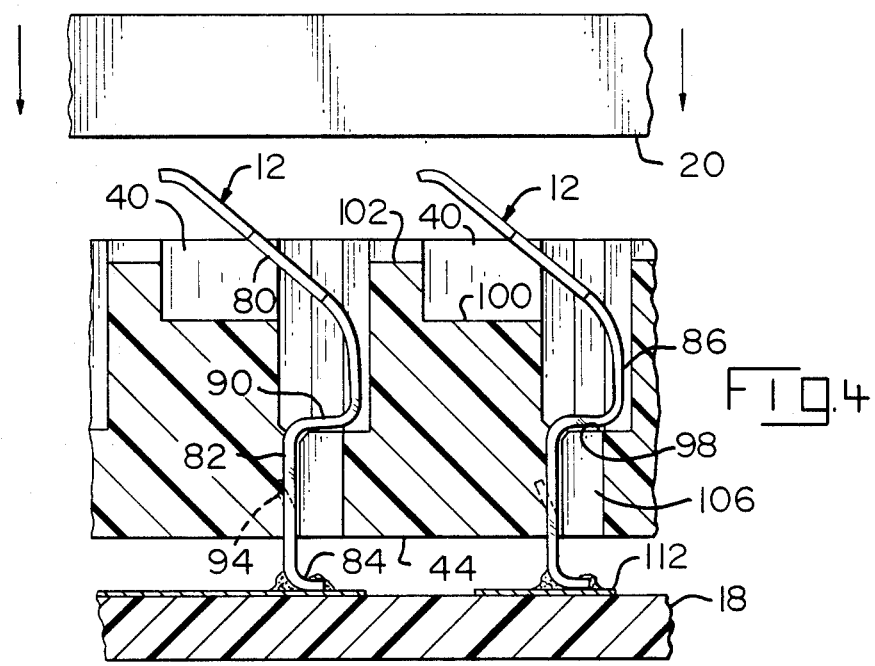
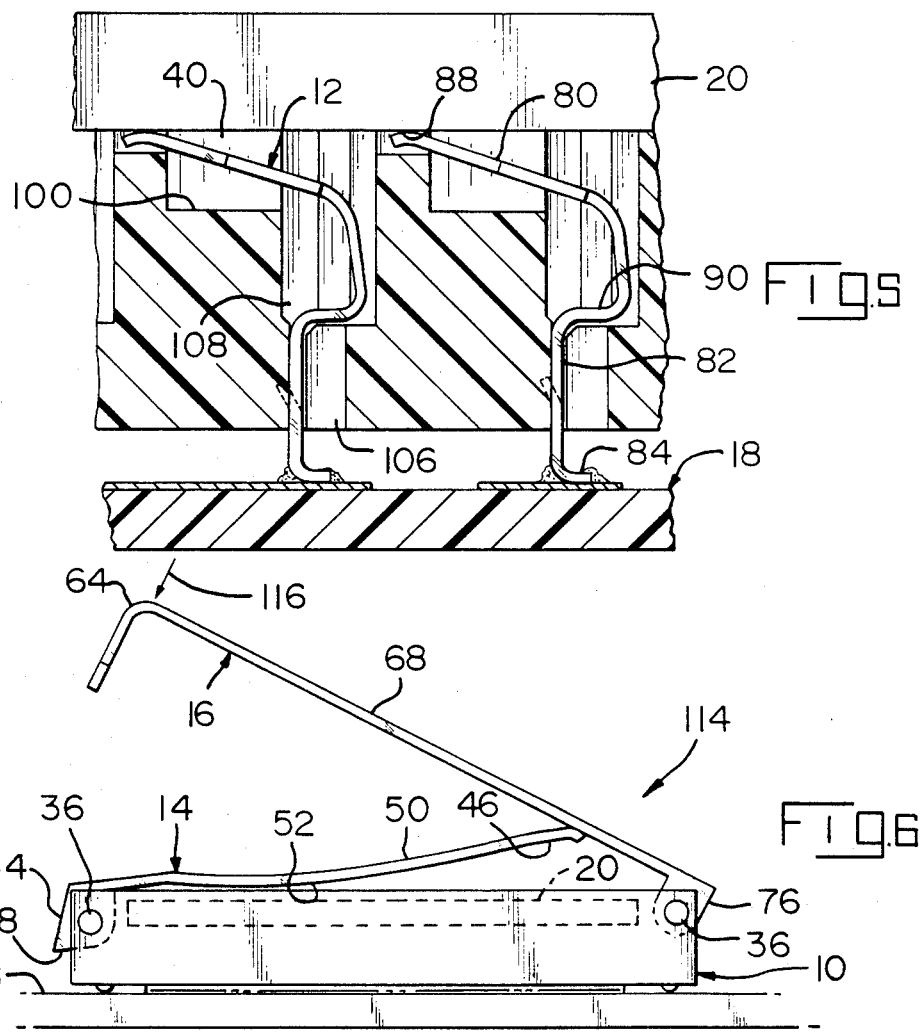

PAD ARRAY SOCKET

This application is a continuation of application Ser. No. 391,621 filed June 24, 1982, now abandoned.

BACKGROUND OF THE INVENTION

1. Field of the Invention

The invention disclosed herein is a socket for being mounted on a printed circuit board or the like and for receiving therein a flat chip carrier having conductive pads on one surface. Contact elements in the socket carry signals between the board and carrier. Two opposing hinged frames cooperate to bias the chip carrier against the contact elements.

2. Prior Art

U.S. Pat. No. 4,278,311 discloses a connector; i.e. a socket, comprising an insulating housing with spring members or contact elements positioned therein and a hinged cover having spring fingers for urging a chip carrier against the spring members. The contact elements, S-shaped, are positioned in individual cells boarding a central compartment with the conductive pads on the carrier's periphery bearing against contact surfaces on the upper horizontal portion. The biasing means on the hinged cover are horizontal L-shaped fingers which bear against the carrier directly over the contact surfaces.

SUMMARY OF THE INVENTION

The invention disclosed herein is a socket mounted on a printed circuit board and having a chip carrier receiving opening therein. A plurality of contact elements are positioned in the socket housing with an upper end having a contact surface adapted to engage conductive pads on the carrier and the lower end adapted to be connected to conductive traces on the board. The carrier is held firmly against the contact surfaces of the contact elements by two frames which are hinged at opposing sides of the socket housing with one frame being overlained by the other with a substantial increase in forces being exerted against the carrier to insure good electrical connections between the pads and contact surfaces.

BRIEF DESCRIPTION OF THE DRAWINGS

FIG. 1 is an exploded, isometric view of the several components of the socket constructed in accordance with the present invention: a chip carrier and a section of a printed circuit board are also shown;

FIG. 2 is an enlarged view of a cavity in the socket housing and of a contact element positioned therein;

FIG. 3 is a top plan view of a stamped contact element prior to be formed into the FIG. 2 shape;

FIG. 4 is a sectional view of a socket mounted on a board;

FIG. 5 is a FIG. 4 view but with a carrier loaded into the socket; and

FIG. 6 is a view illustrating the two hinge frames of the present invention and their utility.

DESCRIPTION OF THE INVENTION

With reference to FIG. 1, the components of the socket of the present invention include housing 10, contact elements 12, first hinge frame 14 and second hinge frame 16. The drawing in FIG. 1 also shows printed circuit board 18 on which the socket is mounted (FIG. 4) and chip carrier 20 which may be placed in the socket so that its electronic components (not shown) may be connected to the circuitry on the board through contact elements 12.

Socket housing 10 is preferably molded from a suitable insulating plastic such as polyethersulfone. A centrally located opening 22 extends vertically through the housing to facilitate chip carrier cooling, recess 24 in the top surface 26 of the housing provides a carrier-receiving area with the walls defining the recess providing polarizing keys such as those indicated by reference numeral 28. Notch 30 in one wall receives polarizing key carrier 31 which is removable to provide access to cavities underlying key 28 on carrier 31.

Slots 32, located in the outer surfaces of the housing and adjacent each corner provide clearance for mounting ears on hinge frames 14 and 16. Holes 34 which intersect the slots, receive roll pins 36 which attach the hinge frames to the housing. Two wide notches 38, located on one outer side of the housing, provide access for a tool; e.g., a screwdriver (not shown) to release the hinge frames.

A number of cavities 40 are located in housing 10. These cavities extend through the housing, opening out onto floor 42 and also underside 44 (FIG. 2). The cavities are on a diagonal spacing to provide sufficient room for the elongated contact surface portion of elements 12. The configuration of cavities 40 will be taken up in detail below.

Contact elements 12 will also be described in detail later on. Hinge frames 14 and 16 are preferably made from a spring material such as high carbon steel.

First hinge frame 14 includes front and back rails, 46 and 48 respectively, joined by curved side rails 50 with the convex surfaces 52 thereon facing downwardly. Mounting ears 54 extend downwardly from each end of back rail 48. Holes 56 in the ears allow roll pins 36 to slide therethrough. The base of each ear is wide so that with the frame mounted on housing 10, a portion providing a downwardly facing shoulder 58 projects outwardly therefrom. FIG. 6 shows this clearly.

Second hinge frame 16 is also an open frame with front and back rails 64 and 66 respectively being joined by side rails 68. Latch 70 extends down from front rail 64. The short cross bar 72 on the latch cooperates with downwardly facing shoulders 58 to latch the two hinge frames in a closed position on housing 10. Bars 74 cross in front of notches 38 and provide a fulcrum point to unlatch the hinge frames. Ears 76 extend downwardly from each side of back rail 66. Holes 78 allow roll pins 36 to slide therethrough.

Turning to FIG. 2, the drawing illustrates a stamped and formed contact element 12 exploded out of a receiving cavity 40 which has been vertically sectioned to disclose its interior configuration.

Contact element 12 includes an upper spring section 80, an intermediate retaining section 82 and a lower solder tail section 84. The upper spring section 80 converges inwardly incrementally from its base 86 upwardly to its contact surface 88. This particular shape allows this section to be deflected severely downwardly without losing its resiliency. Contact surface 88 is curved with a convex surface facing upwardly.

A short horizontal strap 90 connects upper spring section 80 to retaining section 82. This latter section includes a body portion 92 from which a lance 94 is struck. The lance is attached to the body portion at its lower end and projects obliquely upwardly. The lower corners 96 of the body portion are cut at an angle.

As is apparent from the drawing, retaining section 82 is considerably wider than the other contact element sections. FIG. 3, a stamped but not formed element, shows this. The several features of the element noted above are referenced in this drawing for comparison.

Lower solder tail section 84 consists of a curved tab with the convex surface facing downwardly and the free end being beneath connecting strap 90.

Cavity 40 substantially reflects the shape of contact element 12. The upper portion of the cavity extends downwardly from the recess floor 42 to floor 98. Shallower areas of the upper portion are defined by upwardly facing surfaces 100 and 102, this latter surface extending to the forward end of the cavity. The side walls 104 reflect the variable widths of the upper spring section 80 of element 12.

The lower portion of the cavity includes a reduced area opening 106 which opens out onto underside 44 of the housing 10 and slots 108. Opening 106 bisects floor 98 while slots 108 are between that floor and a front wall 110 of the lower portion. As shown in the adjacent cavities, the forward end of one cavity is common with the back end of the next cavity. This simply is for molding convenience.

The positioning of contact elements 12 in cavities 40 is shown in FIG. 4. The elements are inserted into the cavities from above with section 84 passing through cavity opening 106 to extend below housing 10. As the drawing in FIG. 4 shows, the solder tail section is soldered to conductive trace 112 on circuit board 18. The sides of retaining section 82 on the elements are received in slots 108 with lance 94 digging into one wall defining the slots. Between the lance and strap, element 12 is vertically confined. Horizontal movement is restricted by the sides of the retaining section being in slots 108.

FIG. 5 shows chip carrier 20 positioned in recess 24 and bearing against contact surfaces 88 on elements 12. The upper spring section 80 has been resiliently bent down into the upper portion of cavity 40.

FIG. 6 shows how hinge frames 14 and 16 are attached to housing 10 and how they cooperate to retain carrier 20 in the socket 114 and urge it against contact elements 12. The frames are pivotally attached to the housing with the ears being received in slots 32 and retained by roll pins 36. With both hinge frames in an up position (not shown) carrier 20 is positioned in the recess with polarizing keys 28 being received in appropriately located grooves in the sides of the carrier. First hinge frame 14 is pivoted down with convex surfaces 52 bearing on the carrier. The second hinge frame 16 is pivoted down so that its side rails 68 engage front rail 46. Upon pushing against front rail 64 on frame 16 as indicated by arrow 116, substantially less force is required to push carrier 20 down against the upward forces of the upper spring sections 80 on elements 12. Hinge frame 16 is in effect a lever of considerable length with rail 46 being engaged near the lever's pivot point. The novel two frame arrangement disclosed herein provides about a six to one mechanical advantage over prior art single frame or cover arrangements. The biasing forces being exerted against the socket and circuit board are considerably reduced.

The hinge frames latch together by cross bars 72 on the second frame 16 sliding over ears 54 on first frame 14 and in under shoulders 58. At this point convex surfaces 52 on the first hinge frame will be pressing down uniformly against carrier 20. As noted above, a screwdriver tip can be inserted in grooves 38 and pried against cross bars 74 to unlatch the hinge frames.

We claim:

1. A socket for mounting on a circuit board and for receiving a chip carrier, comprising:
    a. a housing having a chip carrier receiving surface and a plurality of cavities extending therethrough;
    b. a plurality of contact elements positioned in the cavities and having a spring section for engaging conductive pads on a chip carrier placed on the receiving surface;
    c. a first frame having concavo-convex shaped side rails pivotally mounted to one side of the housing and adapted to be rotated down over a chip carrier on the receiving surface with the convex surfaces of the side rails bearing thereagainst;
    d. a second frame pivotally mounted on an opposite side of the housing for being rotated over the first frame; and
    e. first latching means on the first frame at its hinged side and second latching means on the second frame at its free side, said latching means cooperating to latch the two frames together to retain and bias the chip carrier against the contact elements.

2. The socket of claim 1 wherein the first frame includes mounting ears through which the first frame is pivotally mounted to the housing.

3. The socket of claim 2 wherein the first latching means include an outwardly projection, downwardly facing shoulder on each mounting ear and the second latching means include cross bars attached to the free end of the second frame for being removably received under the downwardly facing shoulders to effect the latching.

* * * * *